United States Patent [19]

Chang et al.

[11] Patent Number: 4,994,883
[45] Date of Patent: Feb. 19, 1991

[54] FIELD CONTROLLED DIODE (FCD) HAVING MOS TRENCH GATES

[75] Inventors: Hsueh-Rong Chang, Scotia, N.Y.; Bantval J. Baliga, Raleigh, N.C.

[73] Assignee: General Electric Company, Schenectady, N.Y.

[21] Appl. No.: 416,171

[22] Filed: Oct. 2, 1989

[51] Int. Cl.[5] .................... H01L 29/74; H01L 29/80; H01L 29/78

[52] U.S. Cl. ........................................ 357/38; 357/22; 357/23.4

[58] Field of Search ............. 357/38, 37, 22 E, 22 D, 357/23.4, 39

[56] References Cited

U.S. PATENT DOCUMENTS

| | | | |
|---|---|---|---|
| 4,364,072 | 12/1982 | Nishizawa | 357/22 |
| 4,571,815 | 2/1986 | Baliga et al. | 29/571 |
| 4,587,712 | 5/1986 | Baliga | 29/571 |
| 4,641,174 | 2/1987 | Baliga | 357/58 |
| 4,799,095 | 1/1989 | Baliga | 357/38 |
| 4,827,321 | 5/1989 | Baliga | 357/37 |

Primary Examiner—Rolf Hille
Assistant Examiner—Roy Potter
Attorney, Agent, or Firm—Marvin Snyder; James C. Davis, Jr.

[57] ABSTRACT

A field controlled diode is provided with an insulated gate electrode for controlling the conductivity of the diode. The diode is turned off by applying a gate bias voltage which pinches off the drift region of the device to block current flow in the anode/cathode diode path. The turn-off characteristics of the device are enhanced by including transistor portions in the structure in which the drift region is not pinched off during turn-off to facilitate extraction of stored charge from the diode structure.

13 Claims, 16 Drawing Sheets

FIELD CONTROLLED DIODE (FCD) HAVING MOS TRENCH GATES

RELATED APPLICATIONS

This application is related to U.S. patent application Ser. No. 188,887, filed May 2, 1988, by the present inventors and entitled, "Metal Oxide Semiconductor Gated Turn-Off Thyristor Having an Interleaved Structure", which is incorporated herein by reference.

BACKGROUND OF THE INVENTION

1. Field of the invention

The present invention relates to field controlled diodes (FCDs), and more particularly, to field controlled diodes having reduced gate current levels during turn-off.

2. Background Information

The field controlled diode is a PIN junction diode in which current flow in the reverse direction is blocked by the junction of the diode and in which current flow in the forward direction may be blocked by application of an appropriate voltage to a junction gate to pinch off the cathode-to-anode current path of the diode. When a forward bias voltage is applied across the anode/cathode circuit of the field controlled diode and the field controlled diode is held in the off state by the bias voltage applied to the junction gate electrode, there is substantially no current flow between the anode and cathode electrodes. However, a current which can vary between small and significant flows in the gate circuit because a reverse bias is applied to the gate junction to create the depletion region which pinches off the anode/cathode conductive path. This reverse biased junction collects any thermally generated carriers which would otherwise flow in the anode/cathode circuit. The level of this gate current depends on the diode's characteristics and the ambient temperature and radiation conditions, since thermally generated carriers and optically generated carriers both add to the gate current. In order to allow the diode to become conductive under these conditions, the applied gate bias voltage is changed to one which reduces the reverse bias on the gate junction to a level at which the anode/cathode current path is no longer pinched off. Current is then carried in the anode/cathode circuit in the normal manner for junction diodes. Consequently, when the diode is ON, a significant stored charge develops in the body of the diode.

When it is desired to turn the diode off by gate control, a gate bias voltage is applied to the gate electrode which reverse biases the gate junction and produces a depletion region associated with that junction which eventually pinches off the anode/cathode current path. Unfortunately, in order for that depletion region to be depleted of mobile carriers, a substantial portion of the stored charge in the body of the diode must cross the gate/diode junction to be collected by the gate region. This produces substantial gate currents which may be on the order of 50% of the ON-state current of the field controlled diode. Once the gate junction depletion region pinches off the anode/cathode path of the device and the stored charge has been dissipated, the gate current drops to the quiescent value in the manner discussed above.

Unfortunately, the requirement for dissipating the stored charge during the turn-off process for a field controlled diode results in a relatively long switching time for the field controlled diode and the dissipation of substantial power during the turn-off process. Further, the high gate current during turn-off, establishes the power handling capacity which is required in the gate control circuit and that circuit must therefore be capable of handling substantial power.

There is a need for a field controlled diode providing low gate current turn-off of the diode.

OBJECTS OF THE INVENTION

Accordingly, a primary object of the present invention is to provide a field controlled diode structure employing an MOS gate rather than a junction gate.

Another object of the present invention is to provide a field controlled diode having very low gate circuit currents.

Another object of the present invention is to provide a field controlled diode in which positive control of the state of the diode is provided by a gate bias voltage with minimal current flow.

Still another object of the present invention is to provide a rapid turn-off field controlled diode.

SUMMARY OF THE INVENTION

The above and other objects which will become apparent from the specification as a whole, including the drawings, are accomplished in accordance with a preferred embodiment of the present invention through provision of a field controlled diode having an MOS gate disposed in a trench structure with the pedestals between the gate electrode segments being narrow enough that application of an appropriate gate bias voltage to the insulated gate electrode pinches off the portion of the cathode/anode current disposed within the pedestal. The turn-off time for this structure may be shortened by including bipolar transistor segments which do not pinch off interspersed with the diode segments in order to provide a current path for extracting stored charge from the body of the diode. These transistor segments are preferably connected directly between the anode and cathode electrodes so that the high current associated with extraction of the stored charge is part of the main current path of the device and not part of the gate circuit whereby the gate circuit carries no large currents.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
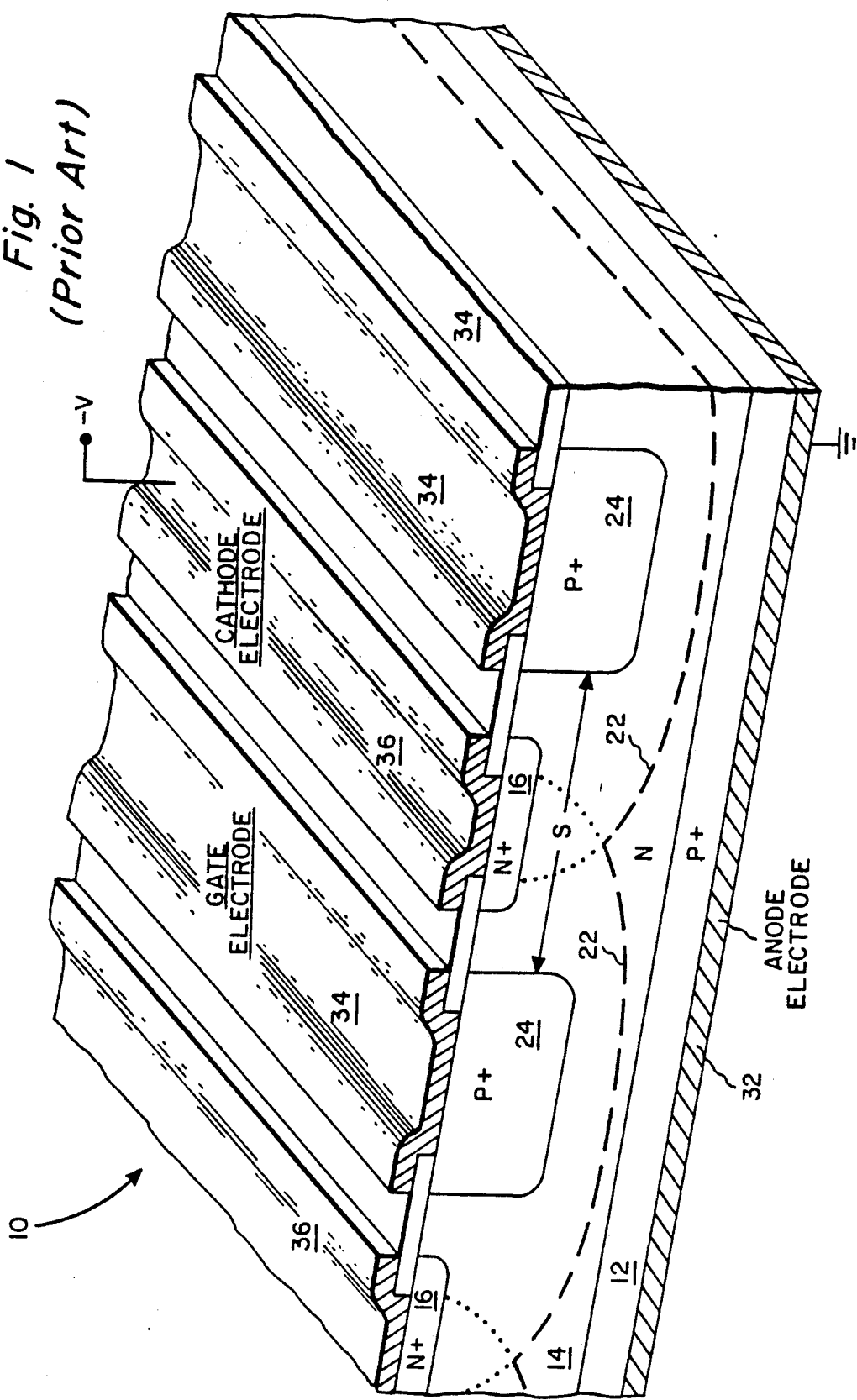
FIGS. 1 and 2 are perspective cross-section illustrations of prior art junction gate field controlled diodes.

In FIG. 1, a prior art surface gate, field controlled diode (FCD) 10 is illustrated in perspective cross-section view. In device 10, the P+ region 12 serves as the anode region of the diode and the electrode 32 serves as the anode electrode of the diode. The N type region 14 serves as the drift region of this PIN diode and the N+ region 16 serves as the cathode contact portion of the diode. The metallization 36 serves as the cathode electrode of the diode. P+ gate regions 24 are diffused into the upper surface of the drift region 14 and have gate metallization 34 disposed in ohmic contact therewith. The lateral spacing S between the P+ gate regions 24 is selected in accordance with the desired gate voltage for pinching off the drift region 14 between the anode region 12 and the cathode region 16. As illustrated by the dashed line 22, the depletion regions associated with the PN junction between the drift region 14 and the gate region 24 extend outward from adjacent the P+ regions 24 and merge under the cathode region 16 in a manner which pinches off the drift region 14, thereby blocking the current path from the P+ anode region 12 to the N+ cathode region 16. The dotted portions of the lines 22 indicate where the edge of one depletion region would be if the adjacent P+ region were omitted, thus, the dotted portions are within the pinched-off region. When a turn-off gate voltage is applied between the gate and cathode regions, the depletion regions 22 merge and prevent diode conduction between the anode and cathode electrodes even in the presence of a cathode-to-anode bias voltage of a polarity and magnitude which would normally forward bias the diode, turning it on. The device is rendered conductive under these conditions by reducing the gate bias voltage to a level at which the depletion regions no longer merge under the cathode region 16 thereby allowing normal diode forward conduction to begin. For maximum forward current in this field controlled diode, the gate bias voltage is reduced to zero in order to substantially eliminate the depletion region 22.

Once this diode is conducting in the forward direction, it may be turned off by reversing the voltage across the anode/cathode circuit in the well-known manner of commutating a normal junction diode. In addition, this device may be turned off by re-applying a gate bias voltage of say 30 volts in order to extend the depletion regions 22 to intersect and pinch off the drift region 14 underneath the cathode region 16.

During the ON-state of this diode, a substantial stored charge develops in the drift region of this device as is normal in PIN junction diodes. During turn-off of the device, this stored charge must be dissipated as part of the turn-off process. This charge dissipates by a combination of recombination within the drift region (a relatively slow process for a low ON-voltage diode) and by extraction of holes through the gate region 24 and a simultaneous equal extraction of electrons through the cathode region 16. As these charge carriers are extracted through the gate region and the cathode region 16, the depletion regions 22 spread until they merge under the cathode, thereby cutting off the anode/cathode current path. The excess charge carriers remaining in the non-pinched off portion of the drift region 14 dissipate by recombination and traversal of the depletion region to the gate region 24. Once the stored charge is dissipated, the diode is in the OFF-state with a minimal reverse current which results from thermal generation of carriers within the device structure. Some of this reverse current flows in the cathode/anode circuit and some of it flows in the cathode/gate circuit depending on the location in which the carrier pair is thermally generated.

Figure 2:
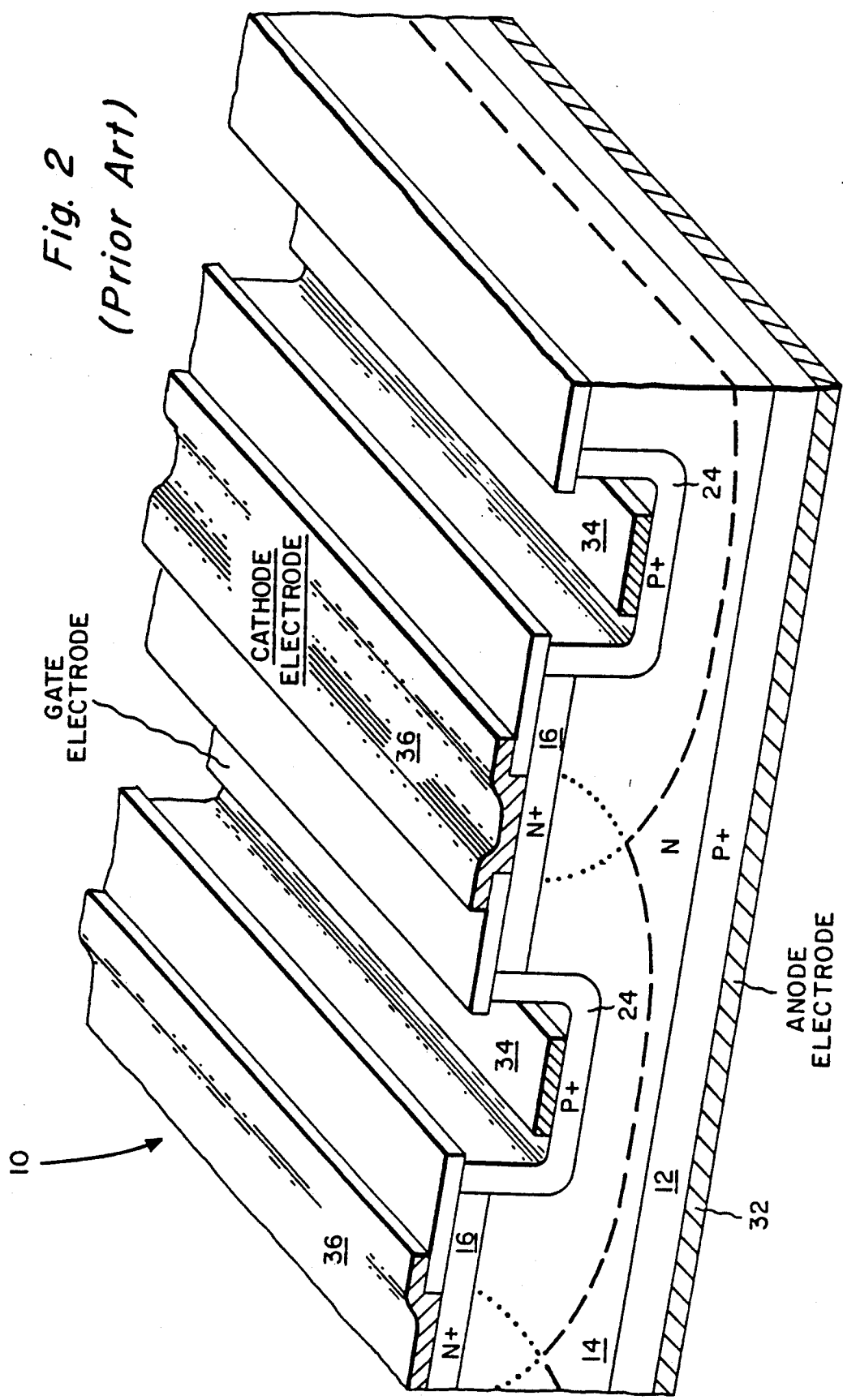

A modified (recessed gate) version of the junction gate field controlled diode is illustrated generally at 10' in FIG. 2 in a perspective cross-section view. This device structure is substantially similar to the structure of the device 10 and the same reference numerals have been used for corresponding structures in both devices. The primary difference between these two structures is the fact that the gate region 24 in the recessed gate structure 10' is formed by first forming trenches in the cathode surface of the device and then diffusing in the P+ gate region. From the process point of view, this has the advantage that deep P+ regions do not have to be diffused into the drift region 14, since the desired relationship between the gate regions 24 and the drift and cathode regions is achieved by the etching of the trenches within which the gate regions are diffused rather than by deep diffusion. This recessed gate device 10' operates in substantially the same manner as the device 10.

Figure 3:
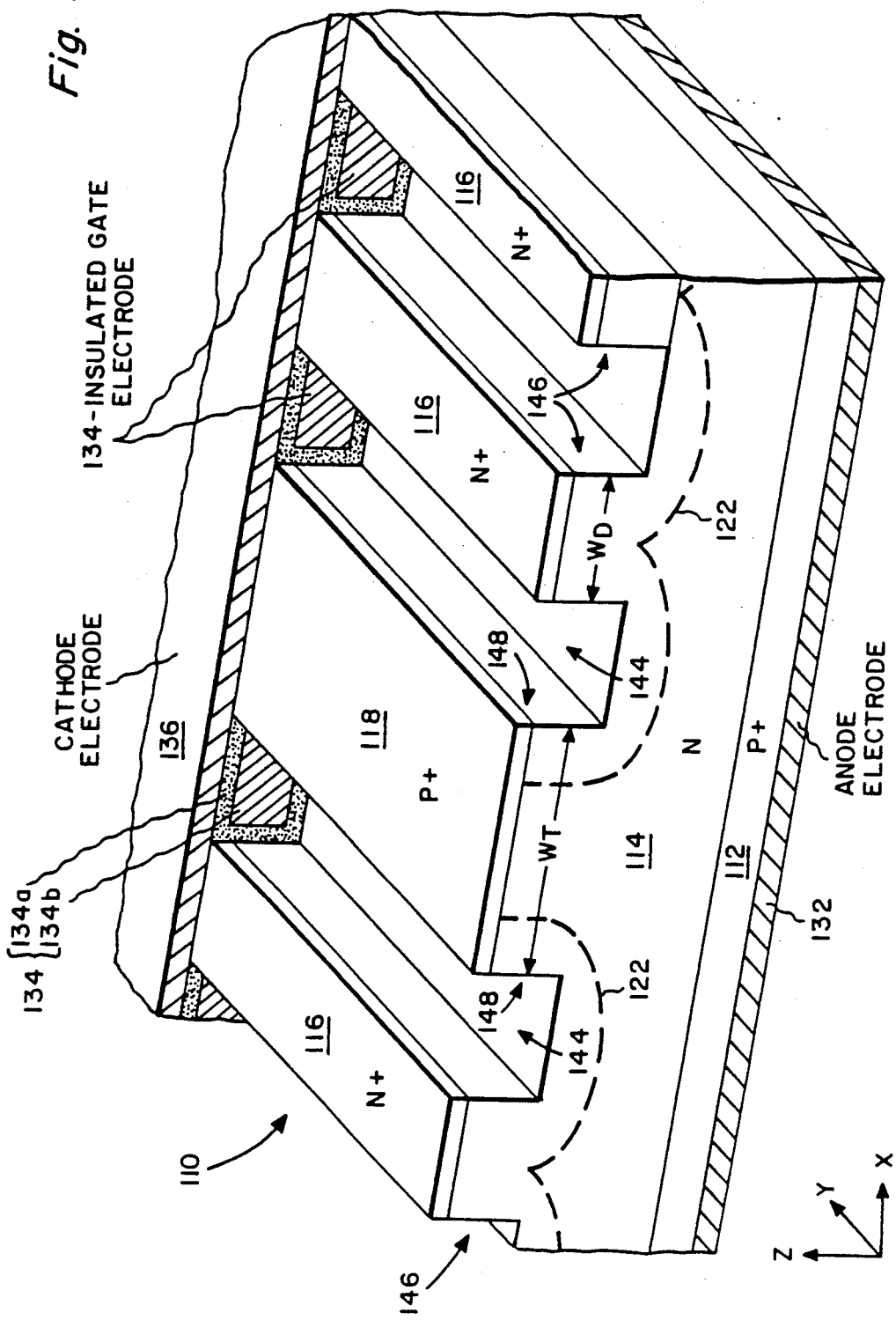
FIG. 3 is a perspective cross-section view of one embodiment of a field controlled diode in accordance with the present invention.

In FIG. 3, a small portion of a field controlled diode in accordance with the present invention is illustrated generally at 110 in a perspective cross-section view. In FIG. 3, reference numerals in the 100's are utilized. In each of the figures, reference numerals ending in the same two digits refer to corresponding structure in the different devices and where the structure serves the same purpose without significant modification in operation or function, some of those portions of the structure may not be discussed in connection with a given figure and the reader is referred to an earlier discussion of that structure for its function and purpose.

The device 110 comprises a plurality of Y-direction extending pedestals separated by intervening gate trenches 144 in which an insulated gate electrode 134 is disposed. The insulated gate electrode 134 and the cathode metallization 136 are illustrated only toward the back of the figure in order to clearly illustrate the remainder of the structure. The insulated gate electrode comprises a gate dielectric (preferably thermal oxide for silicon) layer 134a and a conductor 134b such as polysilicon.

This device comprises a plurality of diode pedestals 146 which are X-direction interspersed with a plurality of transistor pedestals 148, although only one transistor pedestal 148 is shown in the illustration. The diode pedestals or segments 146 in which the cathode region 116 is disposed have a width $W_D$ which is small enough that upon application of an appropriate gate bias voltage, say $-15$ volts, to the insulated gate electrodes 134, the portion of the drift region within the pedestal is pinched off by the depletion region which is induced in the N type drift region by the applied gate voltage. The transistor pedestals or segments 148 in which a P+ collector region 118 is disposed have a width $W_T$ which is great enough that the depletion regions 122 do not merge and deplete the drift region portions of those pedestals. In this way, the current path from the anode region 112 through the drift region 114 to the P+ collector region 118 is not pinched off. The P type anode region 112, the N type drift region 114 and the P type collector region 118 form a PNP transistor whose base current is provided by the stored charge within the drift region. This PNP transistor is connected directly between the anode and cathode electrodes of the FCD so that the transistor's collector current is part of the external cathode current of the FCD rather than part of a gate circuit current. During the process of turning off, the transistor helps dissipate stored charge. This speeds device turn-off and when the stored charge has dissipated, the transistor turns off because of a lack of base current and the device is off. Very little current flows in the insulated gate electrode or its gate circuit during turn-off because of its insulated nature. While the field controlled diode is in the ON-state, some of the device current is carried in this PNP transistor as a result of the base current provided by the stored charge in the drift region. However, the majority of current is carried in the diode structure, especially where a plurality of diode pedestals are disposed between adjacent transistor pedestals in the structure. The number of diode pedestals 146 disposed between adjacent transistor pedestals 148 is a matter of design choice and is selected primarily in accordance with the desired turn-off speed of the field controlled diode which establishes the maximum allowable diffusion time for stored charge to reach a transistor pedestal. This maximum diffusion time increases with increases in the separation between adjacent transistor pedestals and thus increases with increasing numbers of diode pedestals disposed between adjacent transistor pedestals. In this manner, during turn-off of the device, stored charge is dissipated by conduction through the pedestals 148 to the P+ collector region 118 in a manner which is similar to that in which minority charge is removed by the gate region 24 in the prior art junction gate device. However, the circuit consequences of that charge removal are substantially different. As can be seen toward the back of FIG. 3, the cathode electrode 136 is disposed in ohmic contact both with the N+ cathode regions 116 and the P+ collector region 118 whereby the current flowing into the P+ region 118 flows in the anode/cathode circuit of the structure and not in the gate circuit. In this manner, the gate current is kept to a minimum and is essentially that current necessary to charge up the gate capacitance. This device, similar to the prior art device, is turned on in the presence of a forward diode voltage by reducing the insulated gate bias voltage to a level at which the pedestals 146 are not pinched off. When the diode is in the ON-state, the device is turned off by applying an insulated gate bias voltage sufficient to deplete the pedestal 146 portions of the drift region, or by commutation of the externally applied anode/cathode voltage.

Not only does this structure drastically reduce the gate current necessary to turn the device off, but it also provides a relatively rapid turn-off for this device by providing a current path through the P+ region 118 which facilitates the extraction of stored minority charge from the device structure.

Figure 4:
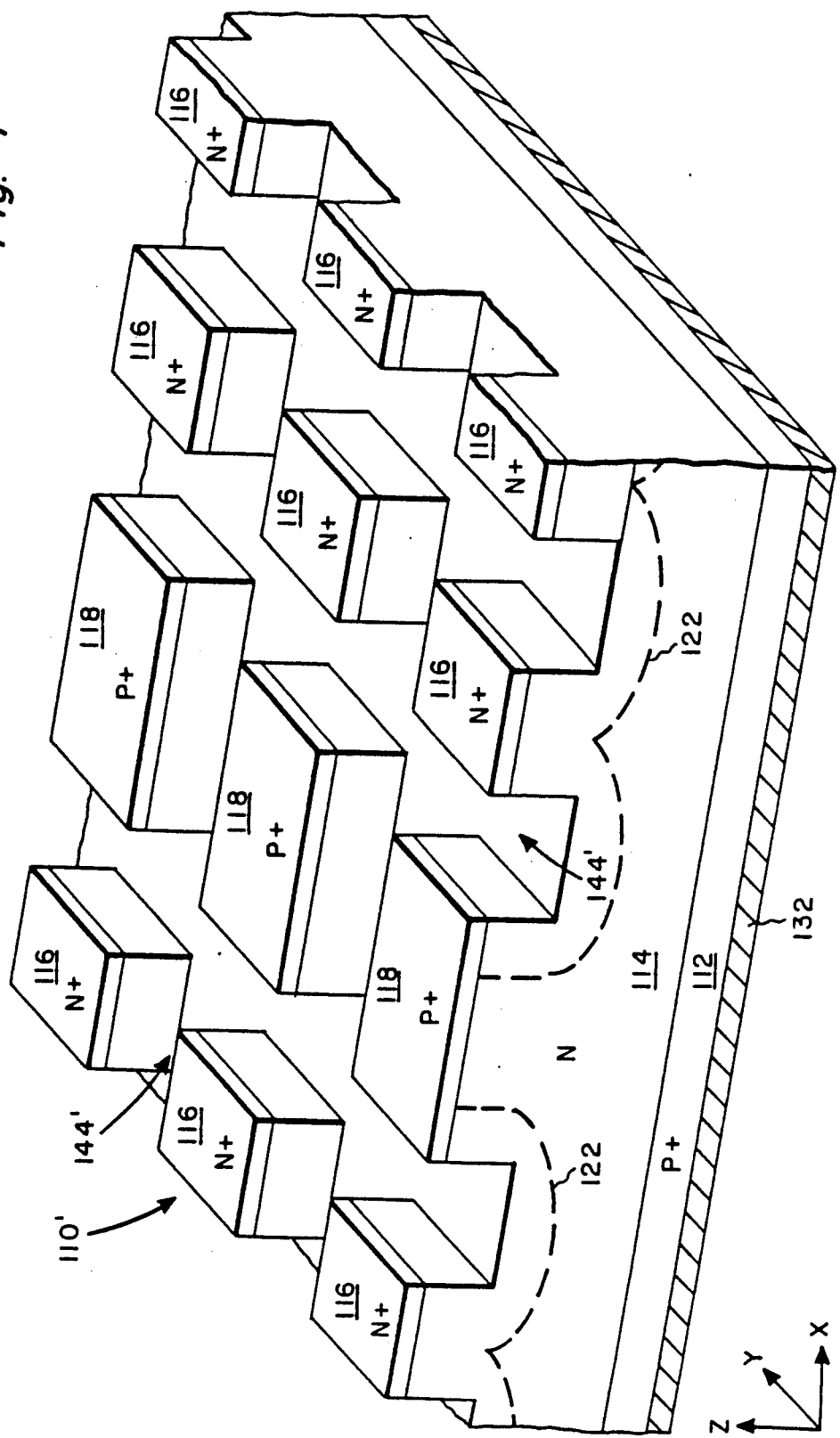
FIGS. 4-16 illustrate alternate configurations for the structure in accordance with the present invention.

In FIG. 4, an alternative version of the FIG. 3 structure is illustrated in which the gate trenches 144' form a grid configuration rather than the parallel stripe configuration of FIG. 3. The device structure is otherwise similar. In FIG. 4, the gate electrode 134 and the cathode electrode 136 are omitted from the drawing for drawing clarity.

Figure 5:
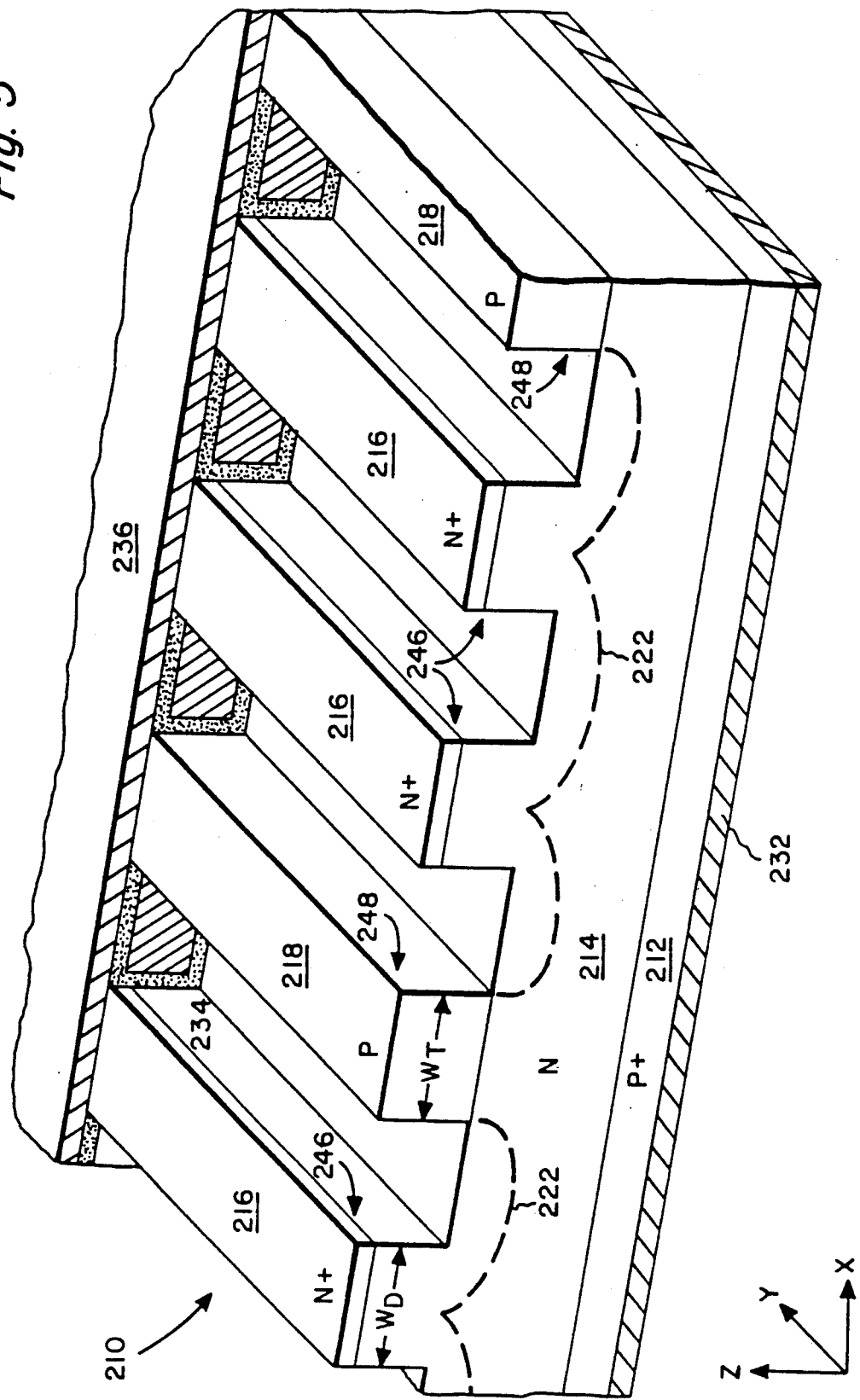

In FIG. 5, another alternative version of a device in accordance with the present invention is illustrated generally at 210 in a perspective cross-section view. The device 210 differs from the device 110 in that all of the pedestal segments (both 246 and 248) have a uniform width ($W_T = W_D$) in the X-direction and in the fact that the P type collector region 218 extends the full height of the pedestal portion 248 rather than being disposed only in the top portion of the pedestal as shown in FIG. 3. As a result of the entire pedestal height being occupied by the P type collector region, the N type drift region 214 does not extend into the pedestals 248 and the applied insulated gate bias voltage does not pinch off the current path from the anode 212 to the P type collector region 218 despite the fact that the pedestals 248 are the same width as the pedestals 246.

The ratio of diode area to transistor area (region 216 area to region 218 area) which is optimum for a given device depends on the intended use of the device and the desired ON-resistance and turn-off time. Where a short turn-off time is considered paramount, the diode and transistor areas may preferably be substantially equal. As low ON-resistance and small chip size become more important, the ratio of diode area to transistor area should be increased to minimize ON-resistance for a given chip area. Increasing the cathode region area to collector region area ratio carries with it an increase in device turn-off time (decrease in speed) because of the increased maximum diffusion distance for a stored charge carrier in the drift region to reach one of the transistor connections to the power electrodes.

Devices in accordance with this invention may be fabricated in a number of ways. It is considered preferable to first define or form the N+ region 116 and the P+ region 118 and to then etch or otherwise form the trench structure 144. Where trenches are desired which are narrower than the trench depth, with the result that diffusing the deep P+ region 218 of device 210 (FIG. 5) prior to etching the trenches would result in the P+ region 218 extending into the pedestals 246 in which only a cathode region 216 is desired, such diffusion is preferably prevented or avoided by implanting the P type dopant material into the region in which the pedestal 148 will be formed, but not driving that diffusion until after trench formation. In this way lateral X-direction spreading of the P type region is prevented by the trench structure. In order to provide the shallow N+ regions 216, the pedestals 148 must then be masked and the N type dopant introduced into the pedestals 246 or else, a relatively slow diffusing N type dopant and a relatively fast diffusing P type dopant or different implant depths must be employed in order to prevent pinch off of the pedestals 248 while ensuring pinch off of the pedestals 246 upon application of an appropriate turn-off voltage to the insulated gate electrode.

Figure 6:
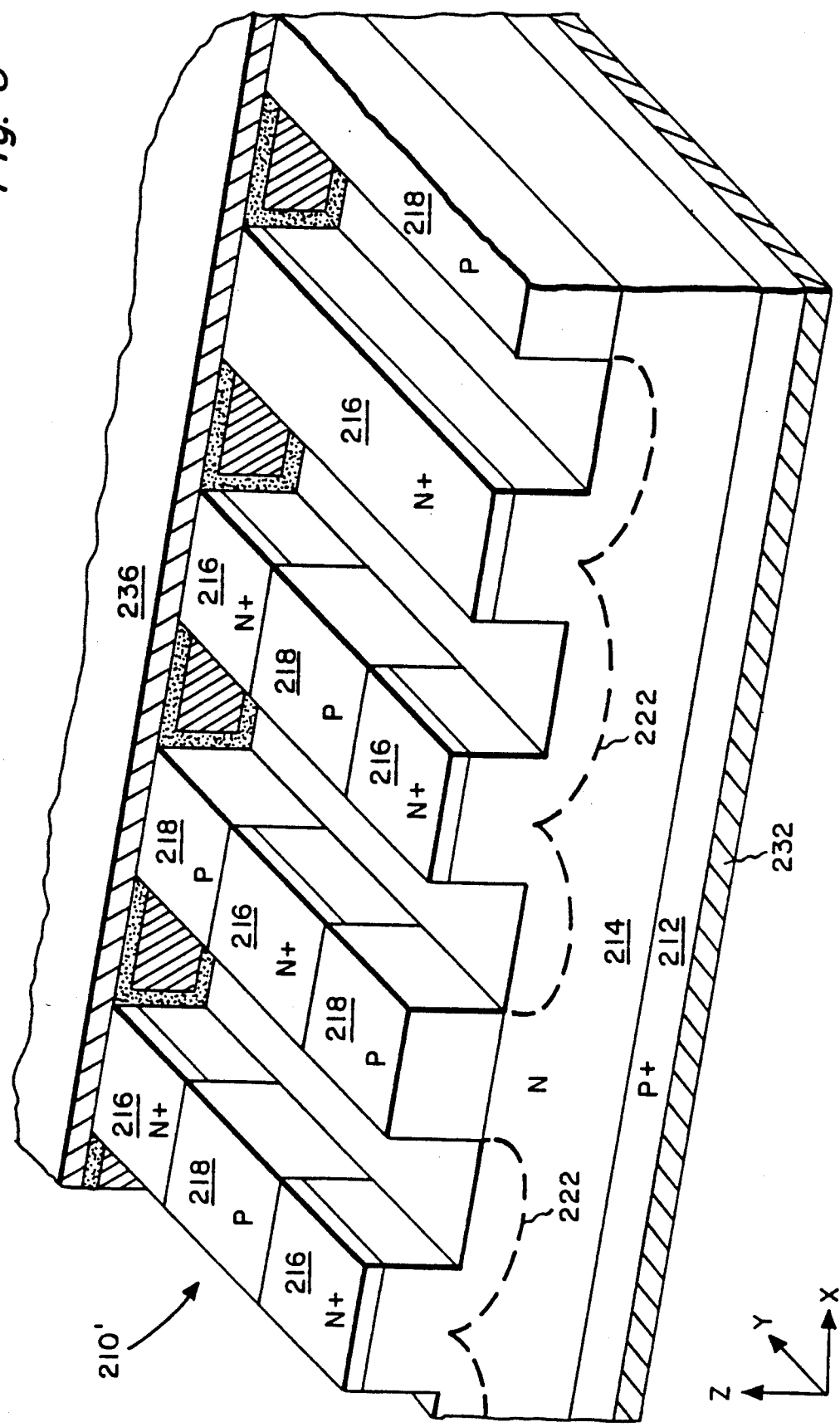

In FIG. 6, an alternative version 210' of the device 210 is illustrated. The structure of this device is similar to that of device 210 except for the fact that rather than having some pedestal segments in which no P type collector region 218 is present and other pedestal segments in which no N+ cathode region 216 is present, each longitudinal (Y-direction) pedestal segment may contain both an N+ region 216 and a P+ region 218 with the P+ region extending the full depth of the pedestal. This structure, like the structure 210, prevents the pinch off of the current path from the anode 212 through the P type collector region 218 to the cathode electrode 236.

Figure 7:
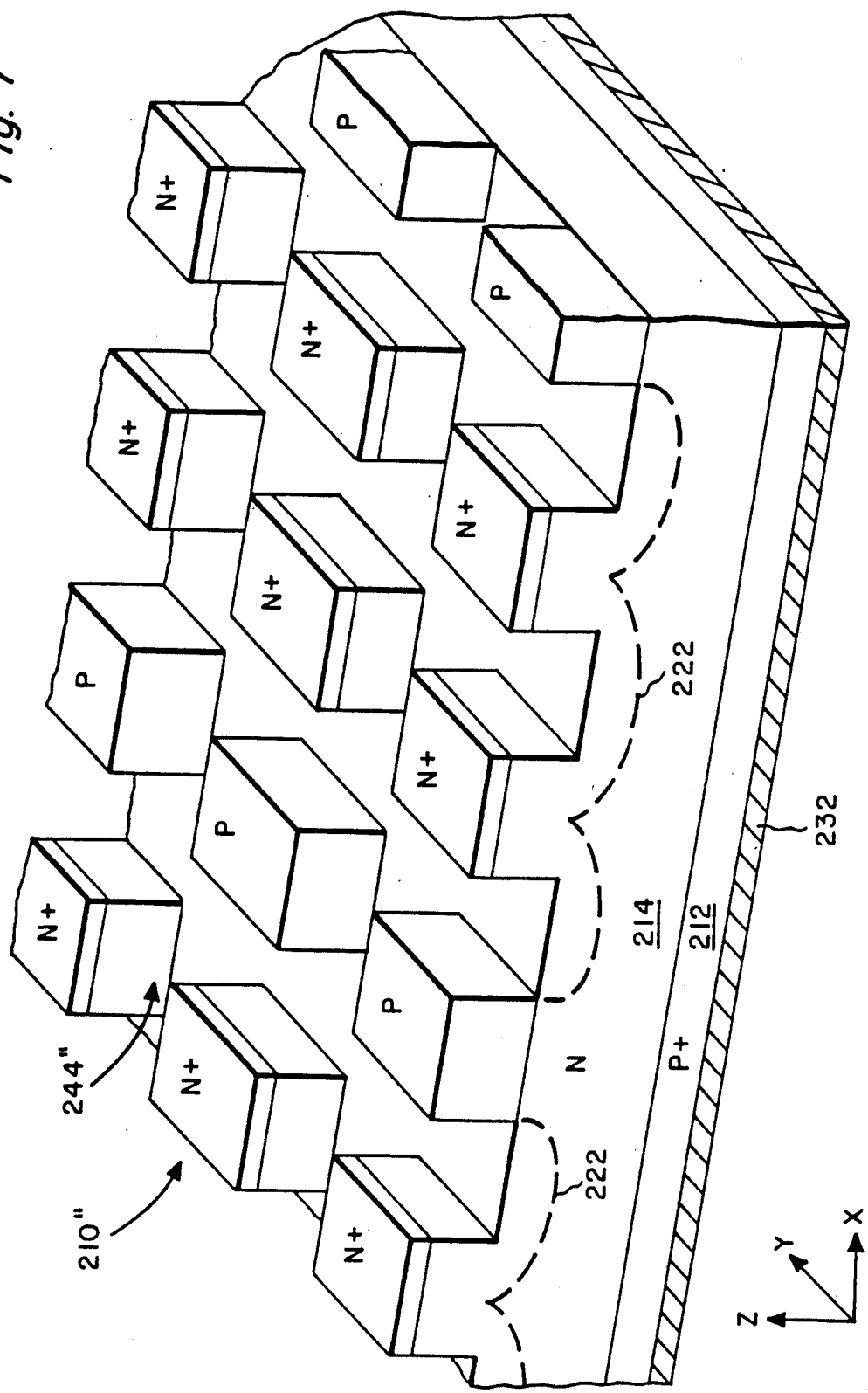

In FIG. 7, a further alternative embodiment 210'' of the device 210 is illustrated. This device is like the device of 210 except for the trench structure 244'' being in the form of a grid structure rather than in the form of parallel stripes as was the case in device 210.

Figure 8:
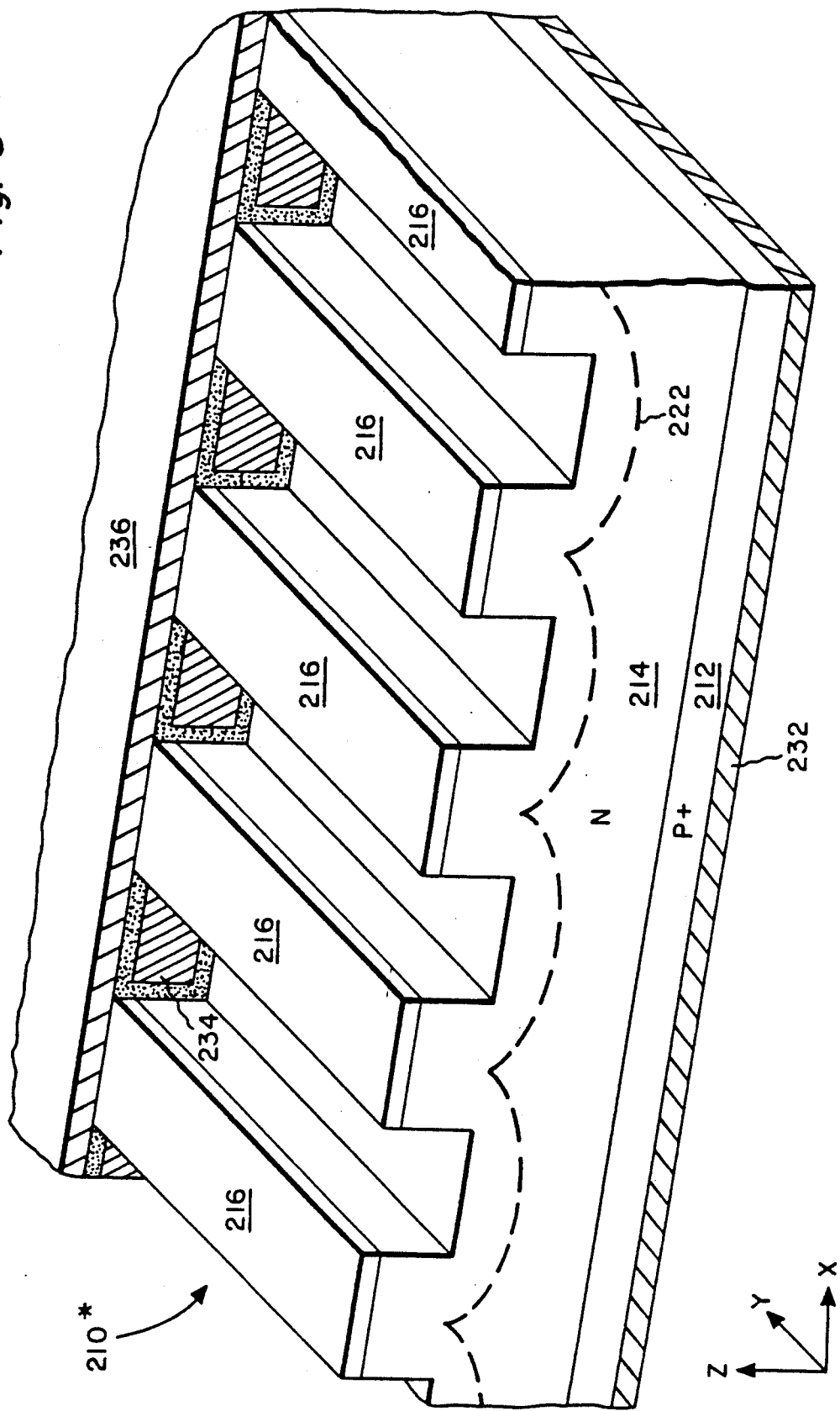

In FIG. 8, a further alternative structure for the device 210 is illustrated at 210*. The configuration of the pedestals in the device 210* is similar to that in the device 210, with the exception that none of the pedestals contain a P type region and each of the pedestals is pinched off at the same applied insulated gate bias voltage. This device structure has a disadvantage as compared to the device structure 210 in that it takes longer to turn off because of the absence of a P+ region suitable for extracting stored charge from the structure during turn-off. As a consequence, the stored charge is dissipated primarily by recombination with the result that the turn-off time for the device structure is increased and the safe operating area for the device is decreased because of the substantial quantity of stored charge present in the structure during turn-off.

Figure 9:
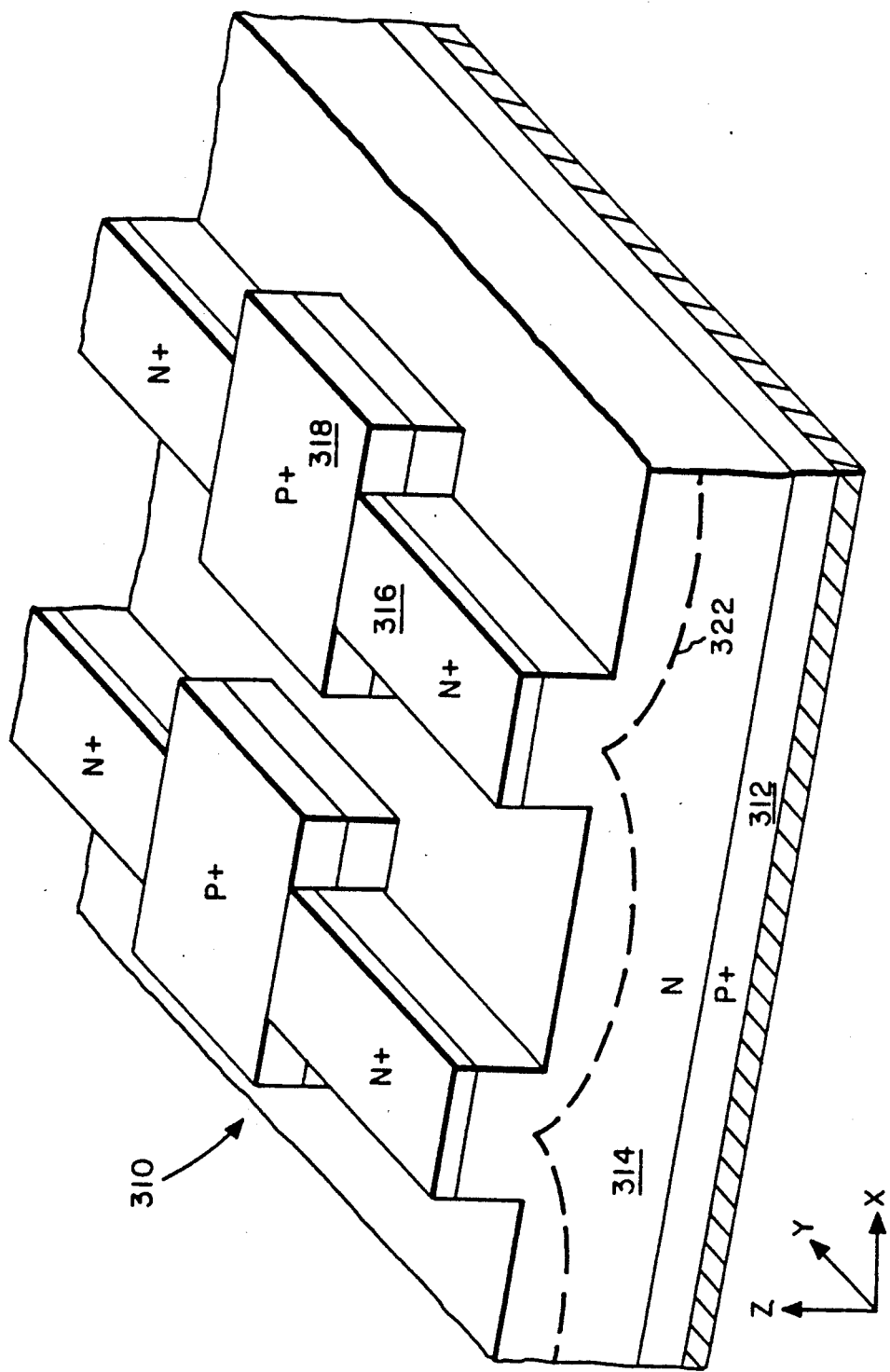

In FIG. 9, a further alternative device structure 310 is illustrated. The device structure 310 is an alternative version of the structure 210′ in that each of the Y-direction extending pedestals which is illustrated in the figure, contains both an N+ cathode region 316 and a P+ collector region 318. This structure differs from that of the device 210′ in FIG. 6 because the P+ region 318 does not extend to the bottom of the pedestal and because the pedestal is wider at the P+ collector region 318 than at the N+ region 316 in order to prevent pinch off of the pedestal portion of the N type drift region 314 under the P+ collector region 318.

Figure 10:
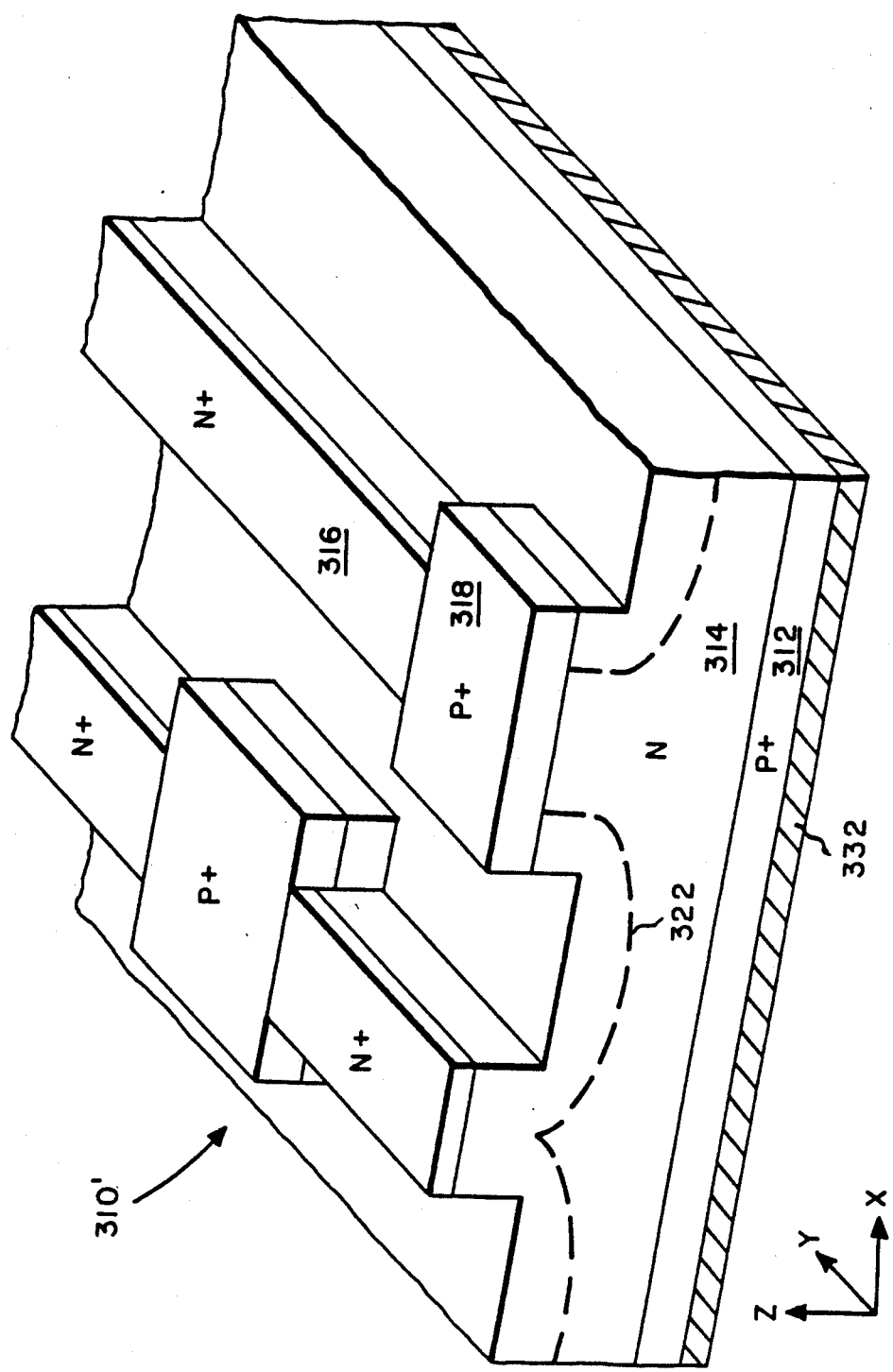

The device 310′ illustrated in FIG. 10 is like the device 310, except that the P+ collector regions 318 in adjacent pedestals are displaced from each other in the Y-direction, thereby reducing the minimum permissible X-direction center-to-center spacing of the pedestals in order to allow adequate space for the gate electrodes.

Figure 11:
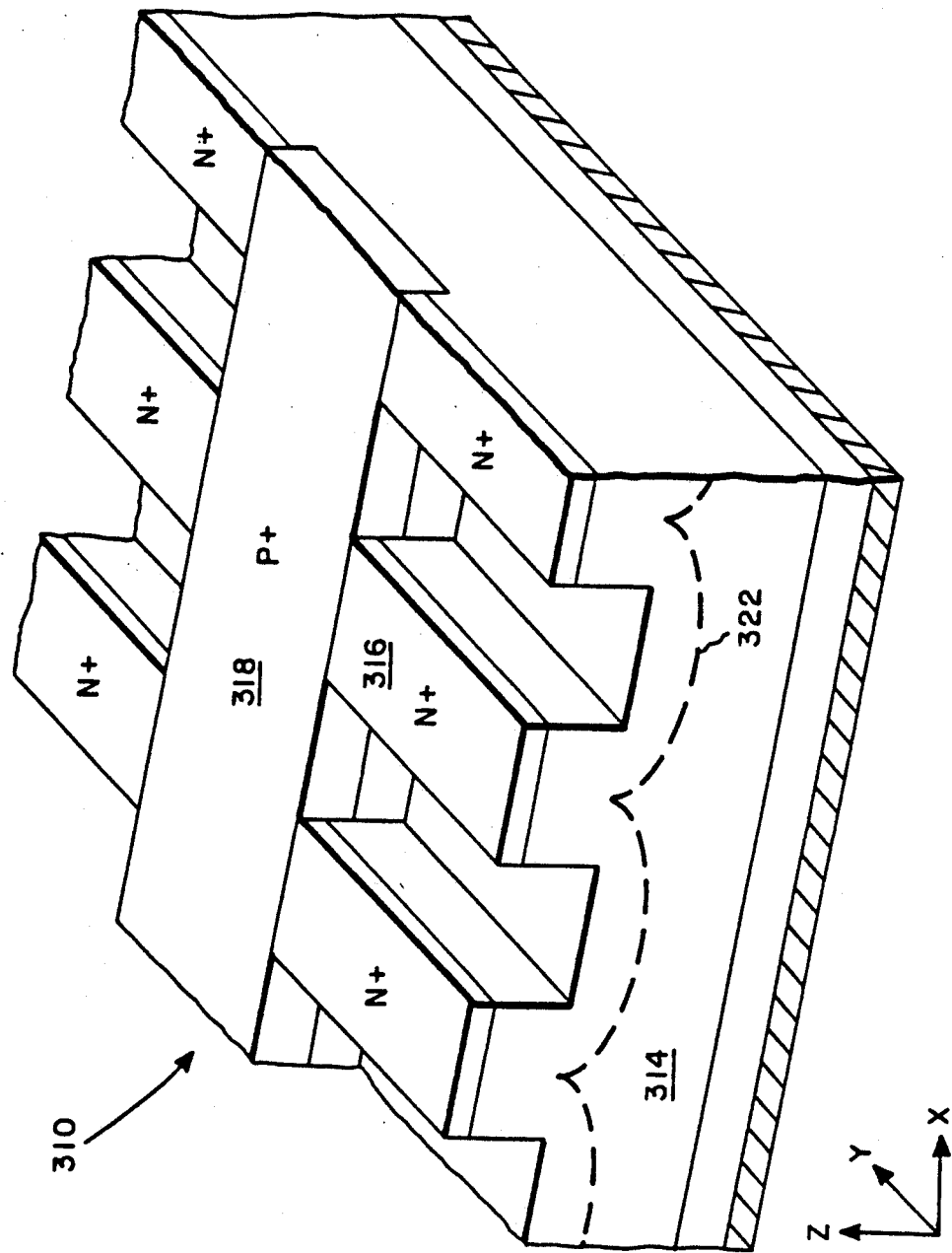

A further alternative structure 310″ is shown in FIG. 11 in which the P+ collector region 318 is made continuous in the X-direction between adjacent "pedestals" by not etching the trench through the P+ collector region.

While in each of the figures a trench structure extending into the semiconductor body from the cathode side of the structure is illustrated, the conductivity type of all regions can be reversed to provide the complementary field controlled diode. Such a reversal is not preferred in silicon because of the substantially higher mobility of electrons than holes in silicon.

While the trench structures illustrated are either Y-direction extending parallel segments or a grid configuration, the trench structure may alternatively have a concentric, circular, rectangular or other configuration, if desired. The significant feature of the invention being the provision of a field controlled diode having an insulated gate for conductivity control and preferably the provision of a transistor structure in the field controlled diode to facilitate more rapid turn-off of the device upon application of a turn-off insulated gate bias voltage to the insulated gate.

Figure 12:
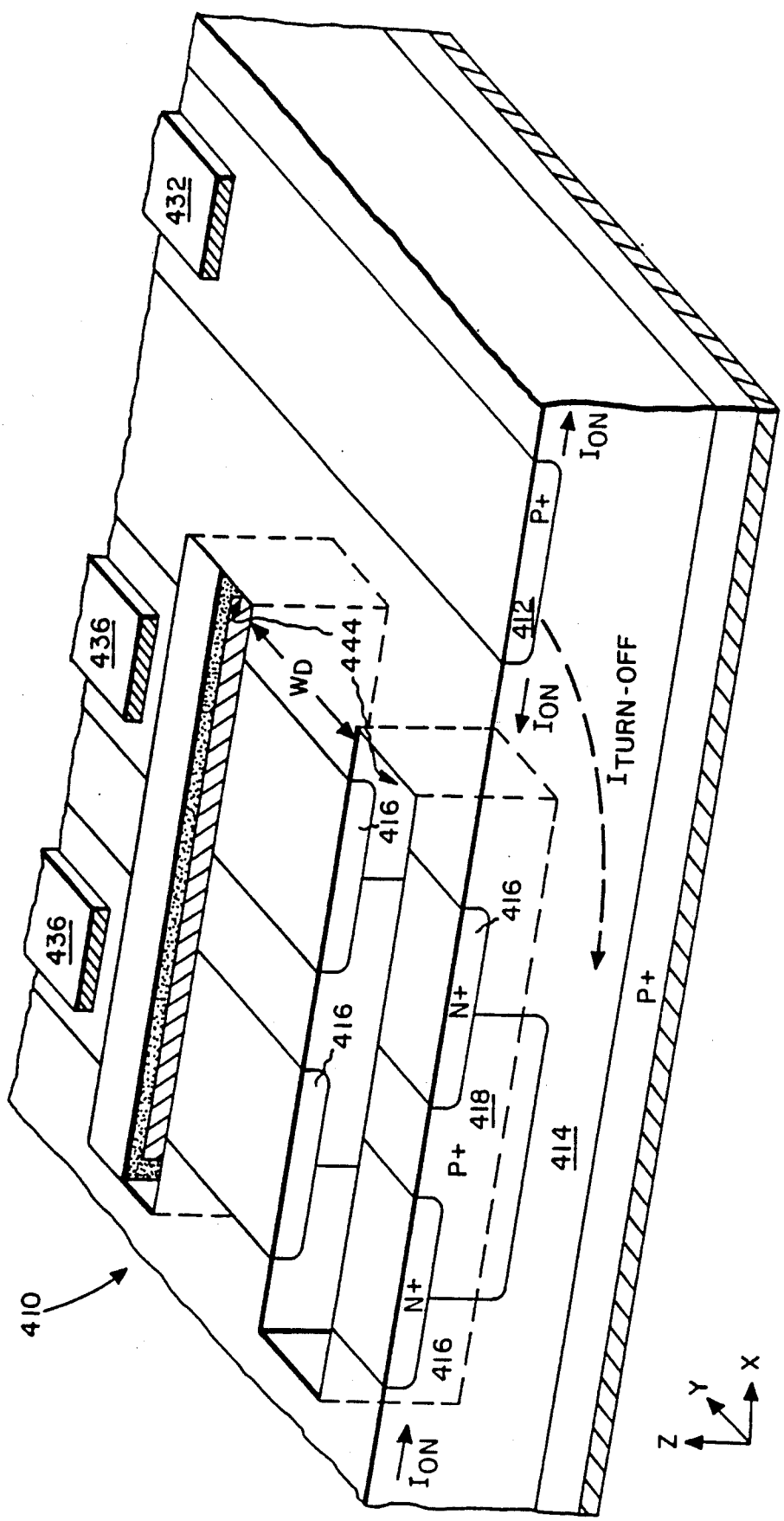

Each of the above discussed and illustrated structures is a vertical device in which the main current flow is vertical through the semiconductor chip perpendicular to the major surfaces of the wafer in which the chip was fabricated. Field controlled diodes in accordance with the present invention may also be fabricated as lateral devices. Such lateral structures are illustrated in perspective cross-section views in FIGS. 12–15. In FIG. 12, the device 410 is a multicellular device in which the structure at the lefthand side of the figure alternates in the X-direction with the structure at the righthand side of the figure whereby current from the anode region 412 flows both to the left and right in the figure. In this device structure, the gate electrodes are disposed in the trenches 444 which divide the cathode region 416 into a plurality of Y-direction spaced apart segments. The width $W_D$ of the "pedestal" between two Y-direction adjacent trench segments 444 is made narrow enough that application of an appropriate gate bias voltage to the insulated gate disposed in the trenches pinches off that pedestal, thereby interrupting current flow to the cathode region 416. In device 410, the ON-state current flows laterally and primarily near the upper surface of the semiconductor body. During turn-off, current flow is blocked through the pedestal portions of the structure with the result that the current during turn-off, which is indicated by the dashed line in FIG. 12, must flow deeper into the semiconductor body than the bottom of the trenches in reaching the P+ region 418.

Figure 13:
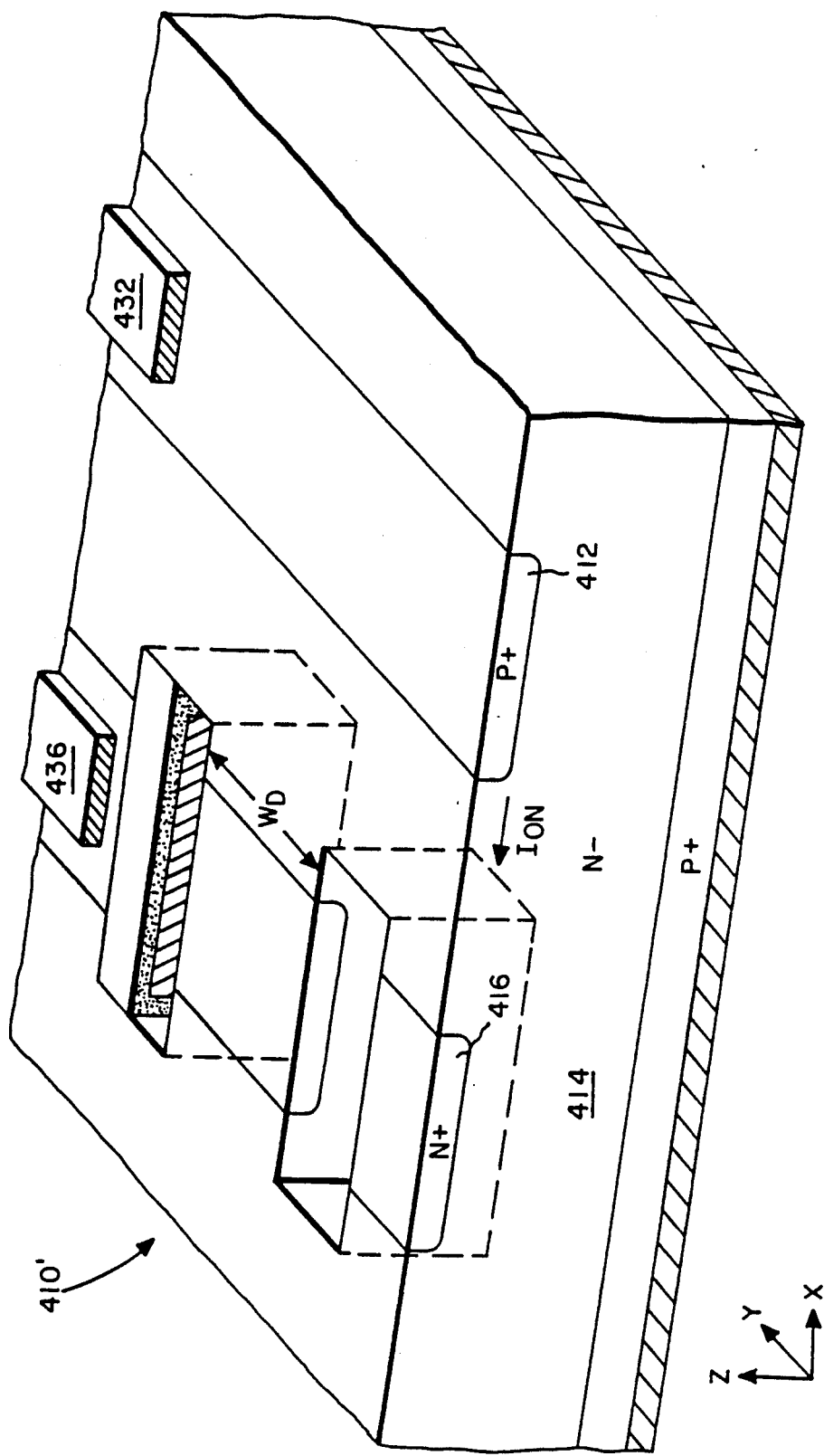
Figure 14:
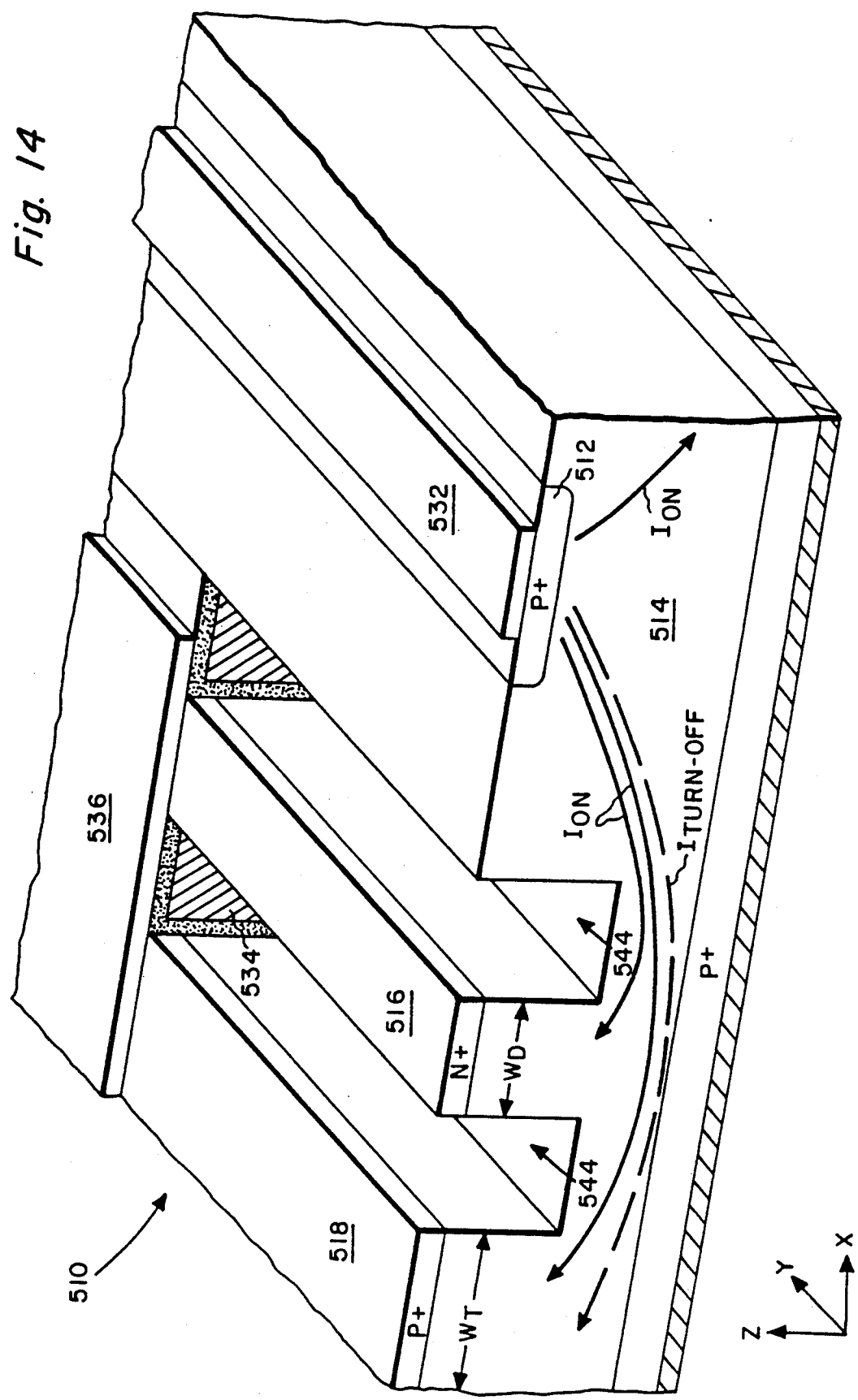

The device 410′ in FIG. 13 is similar to the device 410, except for the absence of a P+ region 418. I Device 510 in FIG. 14 is similar to devices 410 in being a lateral device. It differs in that the trenches 544 extend in the Y-direction and space the cathode region 516 from the anode region 512. Consequently, in this device structure, the ON-state current must flow beneath the gate electrodes to reach either the cathode region 516 or the collector region 518. This structure is also a multicellular structure in which the structure at the righthand side of the figure alternates in the X-direction with the structure at the lefthand side of the figure.

Figure 15:
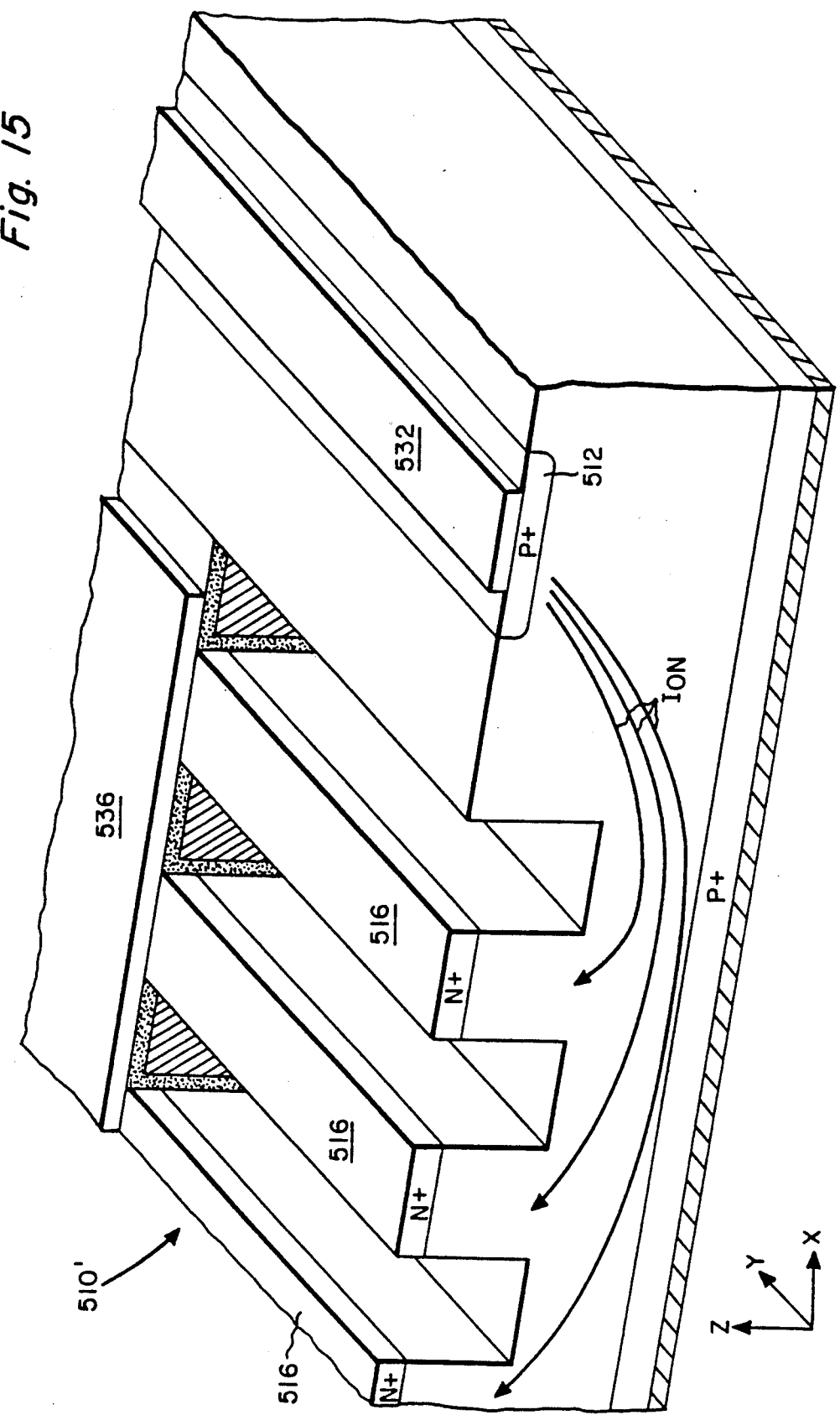

The device 510′ illustrated in FIG. 15 is similar to the device 510 except for the absence of a P+ region 518 from the structure of the device 510′. Again, it is a multicellular structure.

In each of FIGS. 12–15, the device is illustrated as being formed on a P+ substrate, however, it may alternatively be formed in a dielectric or junction isolated region and may be a discrete device or part of an integrated circuit.

Figure 16:
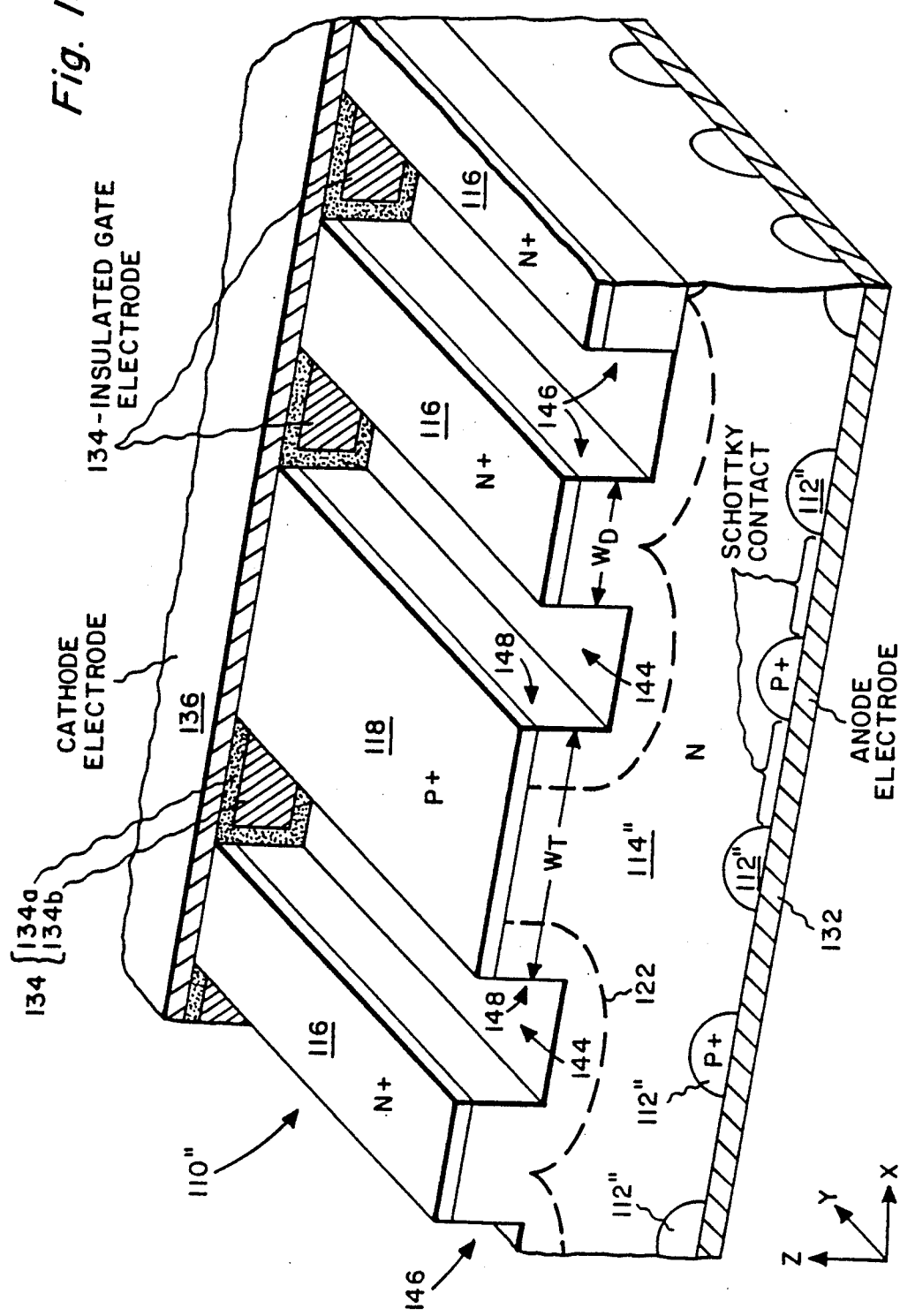

In FIG. 16, a higher speed version 110″ of the device 110 of FIG. 3 is illustrated. In device 110″, the anode region 112″ is grid shaped with openings therein in which the drift region 114″ extends into contact with the anode electrode 132, or the region 114″ contact with the anode electrode is grid shaped with the anode region 112″ comprising separate segments disposed in the openings in that grid or combinations and variations on such structures. The anode electrode material is selected to provide a Schottky barrier where it contacts the N type drift region 114″. In this way, hole injection into the drift region 114″ during the ON-state is reduced, since part of the current is carried through the Schottky diode thereby reducing the stored charge and speeding device turn-off. Schottky barriers of this type may be included in the device structures shown in the other figures as well.

This device may be a normally on device as has been described, or may be a normally off device. Where the doping level of the N type region 114 is low enough (about $1 \times 10^{13}$ dopant atoms per cm$^3$) and the mesa width $W_D$ is narrow enough that the gate electrode work function is large enough that the entire mesa width is pinched off at the zero gate bias, the device is normally off.

A wide variety of device structures and pedestal configurations have been illustrated. Features of different device structures may be combined in a single different structure in any desired manner. All such combinations and permutations are considered to be within the scope of the present invention as defined in the appended claims.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A semiconductor device comprising:
   first and second power electrodes;
   a body of semiconductor material having a first major surface and including adjoining first and second regions disposed in series between said first and second power electrodes, said first power electrode being disposed in ohmic contact with said first region and said second power electrode being disposed in ohmic contact with said second region, said first region being of one type conductivity and said second region being of opposite type conductivity, said first and second regions forming a PN junction at their interface; and
   an insulated gate electrode disposed adjacent to said first region for pinching off said first region in response to appropriate gate bias conditions on said insulated gate electrode, to thereby block the flow of one type conductivity carriers from the vicinity of said first electrode to said second region to turn said device off.

2. The semiconductor device recited in claim 1 wherein:
   said body includes a trench structure extending into said body from said first major surface to provide a pedestal portion of said first region laterally bounded by said trench structure; and
   said insulated gate electrode is disposed in said trench structure adjacent said pedestal portion, said pedestal portion being narrow enough that under said appropriate gate bias conditions, said first region in said pedestal is pinched off.

3. The semiconductor device recited in claim 2 wherein:
   said first region includes a heavily doped portion adjacent said first electrode.

4. The semiconductor device recited in claim 2 wherein:
   said trench structure includes a plurality of substantially parallel segments having parallel pedestal segments disposed therebetween.

5. A semiconductor device comprising:
   first and second power electrodes;
   a body of semiconductor material having a first major surface and including adjoining first and second regions disposed in series between said first and second power electrodes, said first power electrode being disposed in ohmic contact with said first region and said second power electrode being disposed on ohmic contact with said second region, said first region being of one type conductivity and said second region being of opposite type conductivity, said first and second regions forming a PN junction at their interface;
   said body including a trench structure extending into said body from said first major surface to provide a pedestal portion of said first region laterally bounded by said trench structure, said trench structure having a grid configuration with said pedestal portion comprising a plurality of spaced apart segments; and
   an insulated gate electrode disposed in said trench structure adjacent to said pedestal portion and said first region for pinching off said first region in response to appropriate gate bias conditions on said insulated gate electrode to thereby block the flow of one type conductivity carriers from the vicinity of said first electrode to said second region to turn said device, said pedestal portion being narrow enough that under said appropriate gate bias conditions said first region in said pedestal in pinched off.

6. The semiconductor device recited in claim 1 wherein:
   said semiconductor body has a second major surface opposed to said first major surface; and
   said second electrode is disposed on said second surface.

7. The semiconductor device recited in claim 6 further comprising:
   a third region of said opposite type conductivity spaced from said second region by said first region and forming a PN junction with said first region;
   said third region being disposed in ohmic contact with said first electrode; and
   said structure including a current path extending between said third region and said second region through a part of said first region which is not pinched off under said appropriate gate bias conditions.

8. The semiconductor device recited in claim 7 wherein:
   said body includes a trench structure extending into said body from said first major surface to provide a pedestal portion of said first region laterally bounded by said trench structure;
   said insulated gate electrode is disposed in said trench structure adjacent said pedestal portion, said pedestal portion being narrow enough that under said appropriate gate bias conditions said first region in said pedestal is pinched off, except in those portions of said pedestal in which said third region is present.

9. The semiconductor device recited in claim 8 wherein:
   said trench structure includes a plurality of substantially parallel segments having parallel pedestal segments disposed therebetween, said third region being disposed in pedestal segments which are wider than pedestal segments which are free of said third region.

10. A semiconductor device comprising:
    first and second power electrodes;
    a body of semiconductor material having first and second major surfaces and including adjoining first and second regions disposed in series between said first and second power electrodes, said first power electrode being disposed on said first major surface in ohmic contact with said first region and said second power electrode being disposed on said second major surface in ohmic contact with said second region, said first region being of one type conductivity and said second region being of opposite type conductivity, said first and second regions forming a PN junction of their interface;
    said body including a trench structure extending into said body from said first major surface to provide a pedestal portion of said first region laterally bounded by said trench structure, said trench structure having a grid configuration with said pedestal portion comprising a plurality of spaced apart segments;

a third region of said opposite type conductivity spaced from said second region by said first region and forming a PN junction with said first region;

said third region being disposed in ohmic contact with said first electrode;

an insulated gate electrode disposed adjacent to said first region for pinching off said first region in response to appropriate gate bias conditions on said insulated gate electrode to thereby block the flow of one type conductivity carriers from the vicinity of said first electrode to said second region to turn said device off;

said insulated gate electrode being disposed in said trench structure adjacent said pedestal portion, said pedestal portion being narrow enough that under said appropriate gate bias conditions said first region in said pedestal is pinched off, except in those portions of said pedestal in which said third region is present, said third region being disposed in pedestal segments which are wider than pedestal segments which are free of said third region;

said structure including a current path extending between said third region and said second region through a part of said first region which is not pinched off under said appropriate gate bias conditions.

11. A semiconductor device comprising:

first and second power electrodes;

a body of semiconductor material having first and second major surfaces and including adjoining first and second region disposed in series between said first and second power electrodes, said first power electrode being disposed on said first major surface in ohmic contact with said first region and said second power electrode being disposed on said second major surface in ohmic contact with said second region, said first region being of one type conductivity and said second region being of opposite type conductivity, said first and second regions forming a PN junction at their interface;

said body including a trench structure extending into said body from said first major surface to provide a pedestal portion of said first region laterally bounded by said trench structure;

an insulated gate electrode disposed adjacent to said first region for pinching off said first region in response to appropriate gate bias conditions on said insulated gate electrode to thereby block the flow of one type conductivity carriers from the vicinity of said first electrode to said second region to turn said device off;

a third region of said opposite type conductivity spaced from said second region by said first region, forming a PN junction with said first region and extending to the bottom of said pedestal segment, said third region being disposed in ohmic contact with said first electrode;

said structure including a current path extending between said third region and said second region through a part of said first region which is no pinched off under said appropriate gate bias conditions; and said insulated gate electrode being disposed in said trench structure adjacent said pedestal portion, said pedestal portion being narrow enough that under said appropriate gate bias conditions said first region in said pedestal is pinched off, except in those portions of said pedestal in which said third region is present.

12. The semiconductor device recited in claim 11 wherein:

said pedestal segment containing said third region is substantially the same width as pedestal segments which are free of said third region.

13. The semiconductor device recited in claim 1 further comprising:

a third region of said opposite type conductivity spaced from said second region by said first region and forming a PN junction with said first region;

said third region being disposed in ohmic contact with said first electrode; and said structure including a current path extending between said third region and said second region through a part of said first region which is not pinched off under said appropriate gate bias conditions.

* * * * *